United States Patent [19]

DeLong

[11] 4,447,772

[45] May 8, 1984

[54] TEMPERATURE STABLE PULSE COUNTING FM DETECTOR

[75] Inventor: Ronald V. DeLong, Mesa, Ariz.

[73] Assignee: Motorola Inc., Schaumburg, Ill.

[21] Appl. No.: 305,586

[22] Filed: Sep. 25, 1981

[51] Int. Cl.$^3$ .............................................. H03D 3/28
[52] U.S. Cl. ..................................... 329/126; 329/136
[58] Field of Search ............... 329/110, 112, 126, 178, 329/136; 455/214, 298, 312, 337

[56] References Cited

U.S. PATENT DOCUMENTS 4,280,100  7/1981  Dann .................................. 329/126 X

FOREIGN PATENT DOCUMENTS 2507378   8/1975  Fed. Rep. of Germany ...... 329/110
53-127257 11/1978  Japan ................................... 329/110

*Primary Examiner*—Siegfried H. Grimm
*Assistant Examiner*—W. R. Paxman
*Attorney, Agent, or Firm*—Eugene A. Parsons

[57] ABSTRACT

Dual monolithic one-shot multivibrators one of which is connected to receive the FM signal and convert it to pulses and the other of which has a reference oscillator connected thereto for conversion to pulses, the output pulses of both multivibrators being low pass filtered with the filtered signals being combined for differential cancellation to provide a detected signal substantially independent of temperature.

7 Claims, 3 Drawing Figures

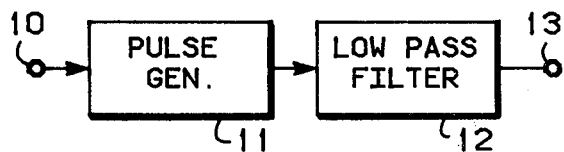
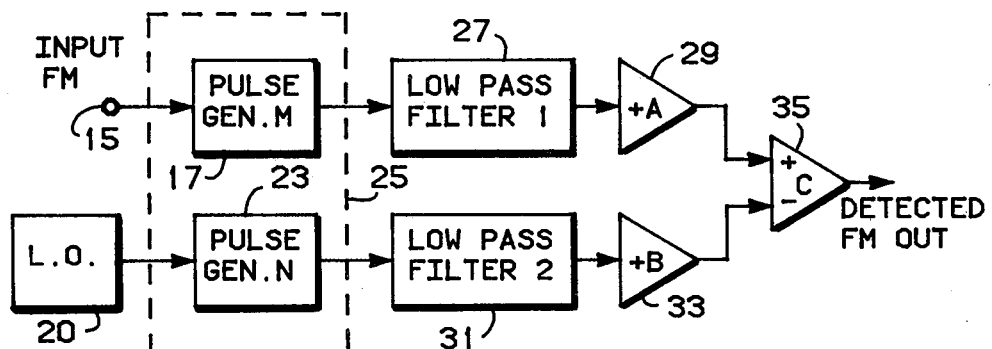
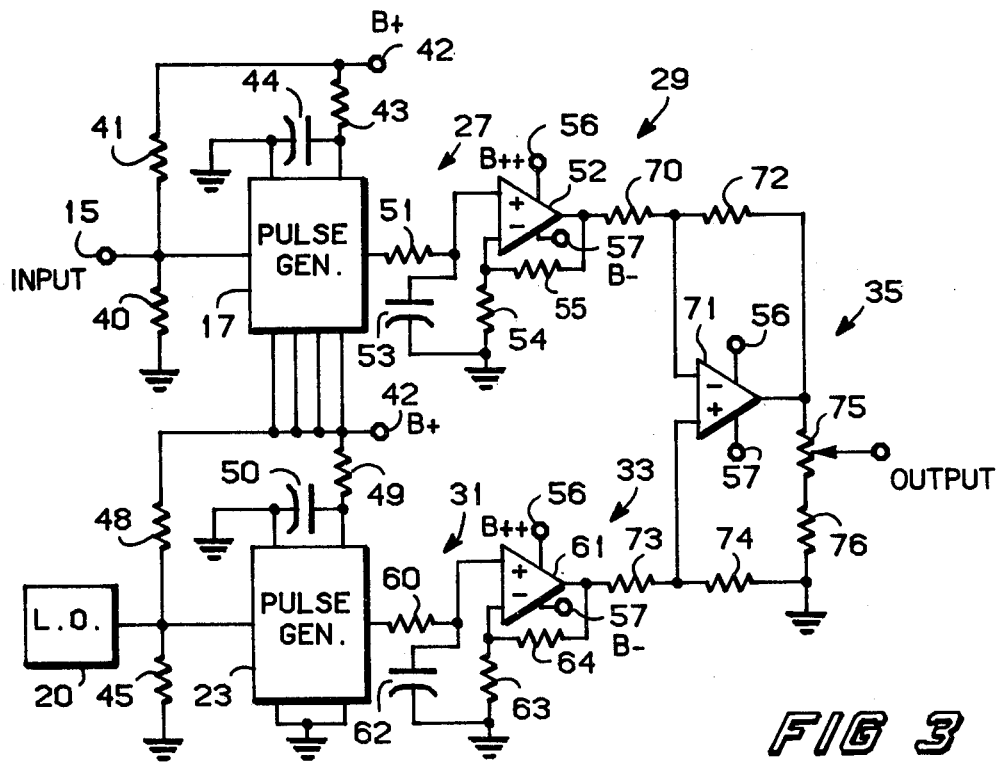

TEMPERATURE STABLE PULSE COUNTING FM DETECTOR

BACKGROUND OF THE INVENTION

In prior art FM detectors, and especially DC coupled digital FM detectors, the circuit for converting the FM signal into pulses is very susceptible to temperature and component changes. Therefore, critical temperature compensating elements must be utilized to stabilize pulse width and prevent variations with changes in temperature and component values. These critical temperature compensating elements are costly and difficult to produce.

SUMMARY OF THE INVENTION

The present invention pertains to temperature stable FM detectors including first and second pulse generating circuits formed on a single semiconductor chip, one of which is connected to receive an FM signal and the other of which is connected to receive a reference frequency signal, the outputs of said chips being low pass filtered and combined to provide differential cancellation so that the detected output signal is substantially independent of temperature and component changes in the pulse-generating circuits.

It is an object of the present invention to provide a temperature-stable DC connected FM detector which is relatively simple and inexpensive to manufacture.

It is a further object of the present invention to provide a temperature stable, DC coupled FM detector which, except for by-pass capacitors, can be readily integrated on to a single semiconductor chip.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a simplified block diagram of a prior art digital FM detector;

FIG. 2 is a simplified block diagram of a temperature stable FM detector incorporating the present invention; and FIG. 3 is a schematic diagram of the detector illustrated in FIG. 2.

DESCRIPTION OF THE PREFERRED EMBODIMENT

Referring specifically to FIG. 1, a simplified block diagram of a prior art FM detector is illustrated. An input terminal 10 is adapted to receive an FM signal to be detected and is connected to a pulse generator 11. The output of the pulse generator 11 is supplied through a low pass filter 12 to an output terminal 13. The FM signal at the input terminal 10 is an amplified preselected and limited signal. Each time the input signal crosses through a predetermined voltage level in a predetermined direction, as determined by the pulse generator 11, an output pulse of a fixed width is applied to the low pass filter 12. Therefore, as the frequency of the input signal increases the number of pulses supplied at the output of the pulse generator 11 increases and vice versa. The low pass filter 12 averages these output pulses such that the output level is determined by $$V_{OUT} = (F_{in})(P_W)(V_+) \quad (1)$$

where $F_{in}$ = frequency of the input signal,
$P_W$ = Pulse width of output pulses from pulse generator 11, and
$V_+$ = voltage corresponding to a "1" level output from pulse generator 11.

The above equation assumes a true "0" level equals 0 volts and is fairly accurate for the use of a CMOS gate. If this were not the case, a more complex, in form, equation would apply but the principle by which this circuit operates would not be fundamentally altered.

The high linearity of the prior art detector illustrated in FIG. 1 can be readily seen by the fact that the $V_{OUT}$ is a direct function of $F_{in}$. It can also be seen that the output level is a direct function of $P_W$ and $V_+$. $P_W$ and $V_+$ are difficult terms to stabilize because they vary with temperature, age of components, changes in power supplies, etc.

Referring specifically to FIG. 2, a simplified block diagram of a temperature stable DC coupled digital FM detector is illustrated. An input terminal 15, adapted to receive an amplified, pre-selected and limited FM signal, is connected to the input of a pulse generator 17. A local oscillator 20, which in this case is a stable, crystal-controlled oscillator, is connected to supply reference signals to the input of a second pulse generator 23. The pulse generators 17 and 23 are formed on a single semiconductor chip 25 and are generally referred to as dual-monolithic one shot multivibrators. The output of the pulse generator 17 is supplied through a low pass filter 27 to the input of an amplifier 29. The output of the pulse generator 23 is supplied through a low pass filter 31 to the input of a second amplifier 33. The outputs of the amplifiers 29 and 33 are combined in a combining circuit 35 so that variations in the pulse generators 17 and 23, due to temperature, component aging, supply voltage changes, and the like, are differentially cancelled and the output from the circuit 35 is a detected FM signal which is substantially temperature stable.

If the frequency of the local oscillator 20 is close enough to the frequency of the input FM signal to produce a beat note which will pass through the low pass filters 27 and 31 and through the amplifiers 29 and 33, cross talk or interference may occur in the output signal. To alleviate this problem the frequency of the local oscillator 20 should be offset from the incoming signal frequency enough to place the beat note outside the range of the low-pass filters 27 and 31 and/or the amplifiers 29 and 33. This offset in the frequency of the local oscillator 20 must be accompanied by a change in the gain of the amplifier 33 and/or the amplifier 29 in order to retain differential cancellation of pulse width variations. The changes in amplifier gains should be accomplished in accordance with the following equation:

$$\frac{F_{in}}{F_{lo}} = \frac{\text{Gain } B}{\text{Gain } A} \quad (2)$$

where $F_{in}$ = input center frequency,
$F_{lo}$ = local oscillator 20 frequency,
Gain B = Gain of amplifier 33, and
Gain A = Gain of amplifier 29.

It should also be noted that, by being able to arbitrarily select $F_{lo}$, a frequency can be chosen which will avoid interference with other signals and IF input frequencies.

Referring specifically to FIG. 3, the temperature stable FM detector of FIG. 2 is illustrated in schematic form. In this specific embodiment the pulse generators 17 and 23 are each a one-shot multivibrator on a monolithic integrated circuit, which is for this example an MC 14528 (Motorola Part Number). Each of the amplifiers 29 and 33 and the combining circuit 35 include a commercially available integrated differential amplifier, CA3240. The input terminal 15 of the detector is connected to pin 5 of the portion of the IC circuit forming pulse generator 17, through a resistor 40 to ground and through a resistor 41 to a terminal 42 adapted to have a positive source of voltage, in this example 5 volts, supplied thereto. The terminal 42 is connected through a resistor 43 to pin 2 of the portion of the IC circuit forming the pulse generator 17. Pin 2 is also connected through a capacitor 44 to pin 1, which is connected to ground. Pins 3, 11, 13 and 16 are connected to the positive voltage terminal 42. The reference frequency from the local oscillator 20 is connected directly to pin 12 of the portion of the IC circuit forming the pulse generator 23, through a resistor 45 to ground, and through a resistor 48 to the positive voltage terminal 42. Pin 14 of the IC circuit is connected through a resistor 49 to the positive voltage terminal 42 and through a capacitor 50 to pin 15, which is also connected to ground. Pins 4 and 8 are also connected to ground.

Pin 6 of the dual monolithic multivibrator IC is the output of the pulse generator 17 and pin 10 is the output of the pulse generator 23. The low pass filter 27 includes a resistor 51 connected between pin 6 of the IC circuit and a positive input of a first differential amplifier 52 included in the amplifier 29. The low pass filter 27 is completed by a capacitor 53 connected between the positive input of the differential amplifier 52 and ground. A negative input of the differential amplifier 52 is connected through a resistor 54 to ground and through a resistor 55 to the output terminal. A positive voltage terminal 56, adapted to have a positive 12 volt supply connected thereto and a negative voltage terminal 57, adapted to have a negative 12 volt supply connected thereto, are connected to the differential amplifier 52 to supply power thereto. In a similar fashion, the low pass filter 31 includes a resistor 60 connected between the output terminal 10 and the positive input terminal of a second differential amplifier 61. The low pass filter 31 is completed by a capacitor 62 connected between the positive input terminal and ground. The negative terminal of the differential amplifier 61 is connected through a resistor 63 to ground and through a resistor 64 to the output terminal thereof. The differential amplifier 61 is also connected to the positive voltage terminal 56 and the negative voltage terminal 57 to supply power thereto. In the specific embodiment illustrated the differential amplifiers 52 and 61 are both included on the same chip (CA3240) for convenience. The positive and negative inputs of the differential amplifier 52 are pins 3 and 2, respectively, of the semiconductor chip and pin 1 is the output of the differential amplifier 52. Pins 5 and 6 of the semiconductor chip are the positive and negative inputs of the differential amplifier 61 and pin 7 is the output thereof.

The output of the differential amplifier 52 is connected through a resistor 70 to the negative input of a differential amplifier 71. Differential amplifier 71 and the associated circuitry forms the combining circuit 35.

The negative input of the differential amplifier 71 is also connected through a resistor 72 to the output thereof. The output of the differential amplifier 61 is connected through a resistor 73 to the positive input of the differential amplifier 71, which is also connected through a resistor 74 to ground. The output of the differential amplifier 71 is connected through a potentiometer 75 and a resistor 76, connected in series, to ground. The moveable contact of the potentiometer 75 serves as the output terminal of the detector. The differential amplifier 71 is one of the amplifiers on a dual differential semiconductor chip with the negative input and positive input being terminals 2 and 3, respectively, and terminal 1 providing the output. The differential amplifier 71 is also connected to the positive voltage terminal 56 and the negative voltage terminal 57 to supply power thereto.

In the present embodiment the FM signal applied to the terminal 15 has a center frequency of approximately 455 kHz and the local oscillator 20 has a frequency of approximately 570 kHz. Values of the various resistors and capacitors utilized in this circuit are listed in the following chart.

| Resistors | Value (K ohms) |
|---|---|
| 40 | 47 |
| 41 | 47 |
| 43 | 10 |
| 45 | 47 |
| 48 | 47 |
| 49 | 10 |
| 51 | 100 |
| 54 | 3.9 |
| 55 | 4.7 |
| 60 | 100 |
| 63 | 6.2 |
| 64 | 4.7 |
| 70 | 4.7 |
| 72 | 4.7 |
| 73 | 4.7 |
| 74 | 4.7 |
| 75 | 1 |
| 76 | 6.8 |
| Capacitors | Value |
| 44 | 47 pfd |
| 50 | 47 pfd |
| 53 | 100 pfd |
| 62 | 1 mfd |

The gain of the differential amplifier 52 is controlled by the values of the resistors 54 and 55 and the gain of the differential amplifier 61 is controlled by the values of the resistors 63 and 64. It will be noted that the value of the resistor 63 relative to the value of the resistor 54, is sufficiently large to bring the gains of the amplifiers 29 and 33 into compliance with the equation (2) set forth above. It will also be noted that in this specific embodiment the low pass filter 31 (specifically capacitor 62) is constructed with a much lower cut off frequency than the low pass filter 27. This is done to help remove any possible noise or other interference from the output of the pulse generator 23 and is possible because the only variations supplied to the low pass filter 31 are those caused by temperature changes, etc. which should be at very low frequencies.

While specific circuits, frequencies and components have been described for exemplary purposes, it will be understood by those skilled in the art that many other types of circuits might be utilized. In place of the one-shot multivibrator utilized as the pulse generators, for example, any of a great variety of signal controlled, pulse generators or the like might be utilized. Further, a wide variety of frequencies might be utilized, which will greatly alter the value of the components, and an offset compatible with the applications should be selected (including 0 if allowable). Thus, the disclosed circuit allows the high linearity of the digital detection method with the ability to recover FM down to and including DC with significantly improved temperature, voltage and time stability.

While I have shown and described a specific embodiment of this invention, further modifications and improvement will occur to those skilled in the art. I desire it to be understood, therefore, that this invention is not limited to the particular form shown and I intend in the appended claims to cover all modifications which do not depart from the spirit and scope of this invention.

I claim:

1. A temperature stable FM detector comprising:
   (a) first and second pulse generating circuits formed on a single semiconductor chip, said first pulse generating circuit being adapted to receive an FM signal to be detected and to generate output pulses in response thereto and said second pulse generating circuit being adapted to receive a reference frequency signal and to generate output pulses in response thereto;
   (b) first and second low pass filters connected to receive the output pulses from said first and second pulse generating circuits, respectively; and
   (c) combining means connected to receive filtered signals from said first and second low pass filters for combining the received signals to provide an output signal of detected FM signals applied to said first pulse generating circuit.

2. A temperature stable FM detector as claimed in claim 1 having in addition a reference frequency signal source connected to supply the reference frequency signal to the second pulse generating circuit, the frequency of said signal source and the frequency of the FM signal to be detected being sufficiently offset to prevent interference therebetween in the output signal.

3. A temperature stable FM detector as claimed in claim 1 wherein the combining means includes a circuit for subtracting the filtered signals of one low-pass filter from the other.

4. A temperature stable FM detector as claimed in claim 1 wherein the pulse generating circuits are DC coupled through the low pass filters to the combining means.

5. A temperature stable FM detector as claimed in claim 1 wherein the first and second pulse generating circuits include dual-monolithic one-shot multivibrators.

6. A temperature stable FM detector as claimed in claim 1 wherein the combining means includes compensating circuitry providing differential cancellation in the combining means.

7. A temperature stable FM detector as claimed in claim 6 wherein the compensating circuitry includes first and second amplifiers connected to receive the filtered signals from the first and second low pass filters, respectively, said amplifiers having gains which differ generally in the following ratio $$\frac{F_{in}}{F_{lo}} = \frac{\text{Gain } B}{\text{Gain } A}$$

where:
$F_{in}$ = center frequency of FM signal to be detected,
$F_{lo}$ = reference frequency,
Gain A = gain of first amplifier, and
Gain B = gain of second amplifier.

* * * * *